(12) United States Patent
Tsai et al.

(10) Patent No.: US 11,114,393 B2
(45) Date of Patent: Sep. 7, 2021

(54) ELECTRONIC PACKAGE AND METHOD FOR FABRICATING THE SAME

(71) Applicant: Siliconware Precision Industries Co., Ltd., Taichung (TW)

(72) Inventors: Wen-Jung Tsai, Taichung (TW); Ching-Chia Chen, Taichung (TW); Ying-Chou Tsai, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 16/534,385

(22) Filed: Aug. 7, 2019

(65) Prior Publication Data

US 2020/0328166 A1 Oct. 15, 2020

(30) Foreign Application Priority Data

Apr. 9, 2019 (TW) ................................ 108112326

(51) Int. Cl.

| H01L 23/66 | (2006.01) |
| H01L 21/48 | (2006.01) |
| H01Q 9/04 | (2006.01) |
| H01Q 1/24 | (2006.01) |
| H01L 23/31 | (2006.01) |
| H01L 23/538 | (2006.01) |
| H01L 21/56 | (2006.01) |
| H01Q 1/38 | (2006.01) |

(52) U.S. Cl.
CPC .......... *H01L 23/66* (2013.01); *H01L 21/4853* (2013.01); *H01L 21/565* (2013.01); *H01L 23/3128* (2013.01); *H01L 23/5386* (2013.01); *H01L 23/5389* (2013.01); *H01Q 1/243* (2013.01); *H01Q 1/38* (2013.01); *H01Q 9/0407* (2013.01); *H01L 2223/6677* (2013.01); *H01L 2223/6688* (2013.01)

(58) Field of Classification Search
CPC ...................... H01L 2223/6677; H01Q 1/2283
See application file for complete search history.

(56) References Cited

U.S. PATENT DOCUMENTS

| 2016/0232386 A1* | 8/2016 | Sehmer .................. H05K 1/181 |
| 2018/0342470 A1* | 11/2018 | Liao ...................... H01L 23/552 |
| 2018/0342788 A1* | 11/2018 | Lasiter .................... H01L 23/66 |
| 2020/0135654 A1* | 4/2020 | Lee ...................... H01L 23/5386 |
| 2020/0279829 A1* | 9/2020 | Elsherbini ............. H01L 25/065 |

\* cited by examiner

*Primary Examiner* — Moazzam Hossain
(74) *Attorney, Agent, or Firm* — Mintz Levin Cohn Ferris Glovsky and Popeo, P.C.; Peter F. Corless; Steven M. Jensen

(57) ABSTRACT

An electronic package and a method for fabricating the same are provided. A plurality of electronic components are disposed in a packaging structure. At least one antenna structure is stacked via a plurality of conductive elements on the packaging structure. The antenna structure is electrically connected to at least one of the electronic components. The electronic components have different radio frequencies. In mass production, the antenna structures of different antenna types are stacked on the packaging structure, and a radio frequency product of various frequencies can be produced. Radio frequency chips of different frequencies need not be fabricated into a variety of individual packaging modules. Therefore, the production cost is reduced, and the production speed is increased.

20 Claims, 6 Drawing Sheets

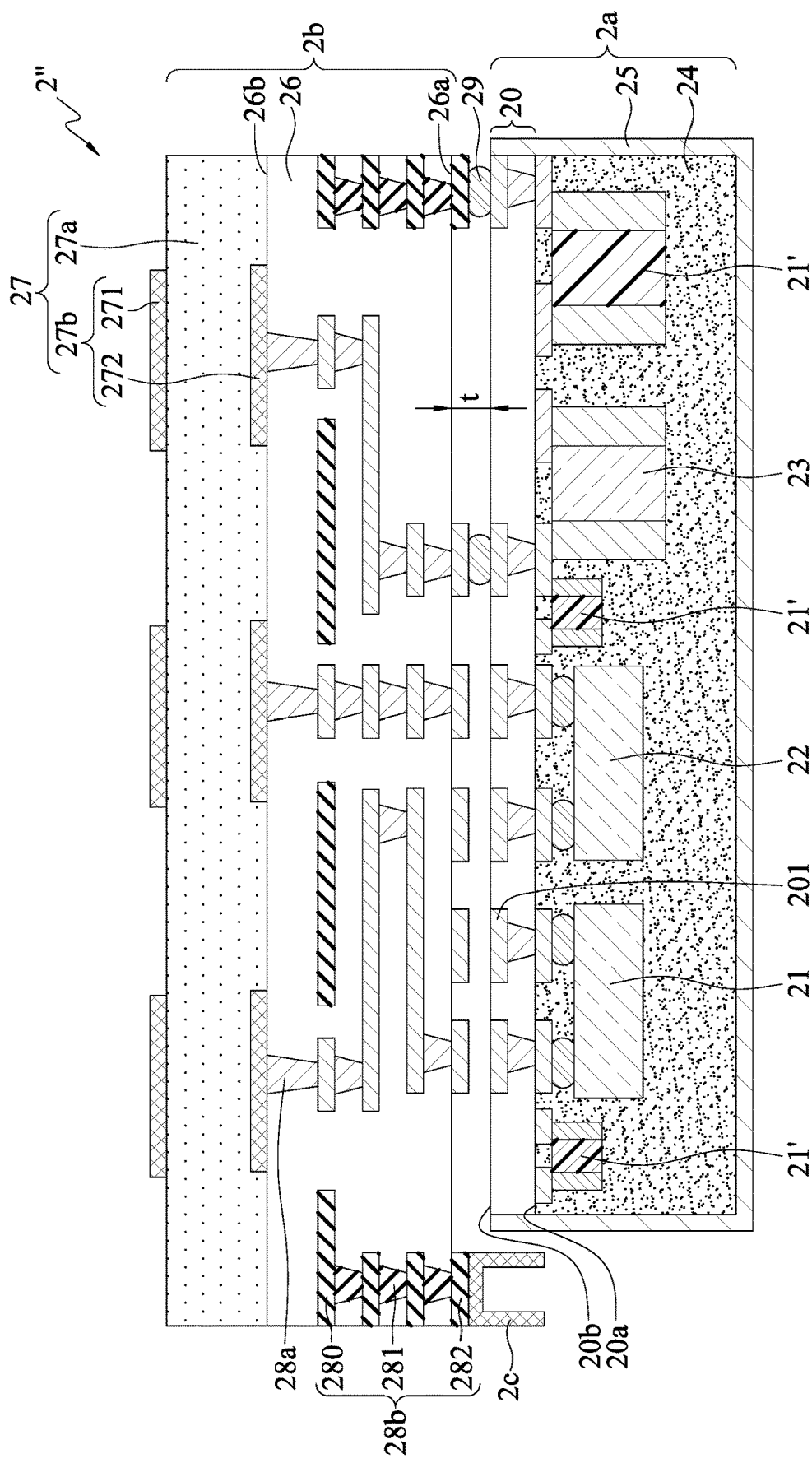
FIG. 2B″

ELECTRONIC PACKAGE AND METHOD FOR FABRICATING THE SAME

This Application claims priority from Application 108112326 filed on Apr. 9, 2019 in Taiwan. The entire contents of this application is incorporated herein by reference in their entirety.

BACKGROUND

1. Technical Field

The present disclosure relates to electronic packages, and, more particularly, to an electronic package having an antenna structure and a method for fabricating the electronic package.

2. Description of the Prior Art

Nowadays, the wireless communication technology has been widely used in a variety of consumer electronic products (such as mobile phones, tablets, etc.) to facilitate the reception or transmission of various wireless signals. To meet the portability and convenience requirements (such as watching multimedia content) of consumer electronic products, the wireless communication module is designed and manufactured to be compact-sized and low-profiled. The patch antenna is widely used in a wireless communication module of an electronic product due to its characteristics of small size, light weight and easy manufacturing.

Due to the improvement of image quality, the current multimedia content has become larger in file volume, so the bandwidth of wireless transmission needs to be greater, resulting in the development of the fifth generation of wireless transmission (5G). Since 5G has a higher transmission frequency, the wireless communication module has a higher demand on size.

The application of 5G is trending for full commercialization in the future. Its application frequency range is about 1 GHz-1,000 GHz. The commercial application mode is incorporating 5G with 4G LTE, and a cellular base station is set up outdoors to match indoor small base station, so 5G mobile communication will use a great number of antennas in the base station to meet the large-capacity fast transmission and low delay of the 5G system.

FIG. 1 is a schematic diagram of a wireless communication module 1 according to the prior art. The wireless communication module 1 comprises a substrate 10, a plurality of electronic components 11 disposed on and electrically connected to the substrate 10, an antenna structure 12, and a molding compound 13. The substrate 10 is a rectangular circuit board. The antenna structure 12 is planer and has a conductive wire 121$a$ and an antenna body 120 electrically connected via the conductive wire 121$a$ to the electronic components 11. The molding compound 13 covers the electronic components 11 and a portion of the conductive wire 121$a$.

Since the antenna structure 12 is planer, it is hard to integrate the antenna body 120 with the electronic components 11 due to the magnetic radiation characteristics between the antenna structure 12 and the electronic components 11 as well as the volume limitation of the antenna structure 12. The molding compound 13 covers the electronic components 11 only, without covering the antenna body 120. Therefore, the molds used in a packaging process have to correspond to the area where the electronic components 11 are disposed, rather than corresponding to the size of the substrate 10, which is adverse to the packaging process.

Since the antenna structure 12 is planer, the substrate 10 has to have an additional area for the antenna body 120 to be formed thereon, and thus has a width hard to be reduced. Accordingly, the wireless communication module 1 also has a width hard to be reduced, and cannot meet the minimization requirement.

To meet the signal quality and transmission speed requirements, the 5G system needs to be arranged with more antennas, to improve the signal quality and transmission speed. In the wireless communication module 1 according to the prior art, the antenna structure 12 is planer, the substrate 10 has fixed length and width, and the circuit layout space (the number of layers) is limited. Therefore, the functions of the antenna structure 12 are limited, which results that the wireless communication module 1 cannot provide electric functions needed for the operation of the 5G system. It is therefore hard to achieve the antenna operation of the 5G system.

If more circuit layers (e.g., 10 or more layers) are added onto the substrate 10 to provide the electric functions needed for the 5G system, the yield factor of the substrate 10 is inevitably reduced. For example, if the yield factor of a circuit layer is 95%, the yield factor of six circuit layers will be reduced to only 73.5% (i.e., $0.95^6$), which increases the fabrication difficulty.

Therefore, how to solve the problems of the prior art is becoming an urgent issue in the art.

SUMMARY

In view of the drawbacks of the prior art, the present disclosure provides an electronic package, comprising: a carrier disposed with a circuit layer and having a first surface and a second surface opposing the first surface; and a plurality of electronic components disposed on the first surface of the carrier and electrically connected to the circuit layer; and at least one antenna structure stacked via a plurality of conductive elements on the packaging structure and electrically connected to the circuit layer and at least one of the electronic components.

The present disclosure further provides a method for fabricating an electronic package, comprising: providing a packaging structure, which comprises: a carrier provided with a circuit layer and a first surface and a second surface opposing the first surface; and a plurality of electronic components disposed on the first surface of the carrier and electrically connected to the circuit layer; and stacking at least one antenna structure via a plurality of conductive elements on the packaging structure, and electrically connecting the at least one antenna structure to the circuit layer and at least one of the electronic components.

In an embodiment, the electronic components are different radio frequency chips.

In an embodiment, the antenna structure has a thickness corresponding to a radio frequency of the electronic components.

In an embodiment, a single one of the antenna structure is stacked on the packaging structure and electrically connected to one of the electronic components.

In an embodiment, a plurality of the antenna structures are stacked on the packaging structure and arranged corresponding to the electronic components, and each of the antenna structures is electrically connected to each of the electronic components, respectively.

In an embodiment, an air gap is formed between the antenna structure and the packaging structure.

In an embodiment, the antenna structure comprises an antenna portion, wherein the antenna portion has an insulating body and an antenna body, and the antenna body has a first antenna layer and a second antenna layer arranged on two opposing sides of the insulating body, respectively. In another embodiment, the antenna structure further comprises a base portion bonded to the antenna portion and stacked via the conductive elements on the second surface of the carrier, and a circuit portion arranged in the base portion and electrically connected to the circuit layer and the antenna portion.

In an embodiment, the antenna structure is an mm wave antenna plate.

In an embodiment, the electronic package further comprises a connector arranged on the carrier or on the antenna structure.

In the electronic package and the method for fabricating the same according to the present disclosure, a plurality of electronic components of different radio frequencies (e.g. radio frequency chips of different frequencies) are disposed in a single packaging structure, and, in mass production, antenna structures of different types of antennas are stacked on the packaging structure, and radio frequency products of different frequencies can be fabricated. It is not necessary to fabricate radio frequency chips of different frequencies into individual packaging modules. In the process of fabricating the electronic package, the antenna structure and the packaging structure can be fabricated independently at the same time (for example, the antenna structure is fabricated by a carrier factory, while the packaging structure is fabricated by a packaging factory, and the antenna structure and the packaging structure are assembled by the packaging factory). Therefore, the number of production lines and the production cost can be reduced, and the production speed and the yield can be increased (or the production time is greatly reduced). If the packaging factory fabricates radio frequency chips of different frequencies into individual packaging modules, the packaging factory has to wait for the carrier factory to fabricate the antenna structure completely, and then fabricates needed individual packaging modules based on the antenna structure (for example, when the carrier factory is fabricating the antenna structure, the packaging factory can do nothing but wait, since the packaging factory does not obtain the antenna specification and cannot fabricate the individual packaging modules).

In the method according to the present disclosure, the antenna structure is fabricated in a circuit substrate process (e.g., the antenna structure is fabricated by a carrier factory), and the antenna structure and the packaging structure can be packaged together (e.g., a packaging factory assembling the antenna structure and the packaging structure), which is of benefit for the packaging process, and ensures that the electronic package meets the miniature requirement.

The antenna structure is fabricated in the circuit substrate process (e.g., the antenna structure is fabricated by a carrier factory), to increase the circuit layout space and the functions of the antenna structure. Therefore, compared with prior art, the electronic package according to the present disclosure can meet the antenna operation requirement of a 5G system, and the yield of the electronic package can be increased.

BRIEF DESCRIPTION OF THE DRAWINGS

The disclosure can be more fully understood by reading the following detailed description of the embodiments, with reference made to the accompanying drawings, wherein:

FIGS. 2B' and 2B" are other embodiments of FIG. 2B; and

DETAILED DESCRIPTION

The following illustrative embodiments are provided to illustrate the disclosure of the present disclosure, these and other advantages and effects can be apparently understood by those in the art after reading the disclosure of this specification.

It should be appreciated that the structures, proportions, size and the like of the figures in the present application are intended to be used in conjunction with the disclosure of the specification. They are not intended to limit the disclosure and therefore do not represent any substantial technical meanings. The details of the specification may be on the basis of different points and applications, and numerous modifications and variations can be devised without departing from the spirit of the present disclosure. As used herein, the terms "over", "first", "second", "a" and the like, are used to distinguish one element from another, and are not intended to limit the scope of the present application. Changes or adjustments are considered to be within the scope of the present disclosure, without departing from the scope of the present disclosure.

Figure 1:
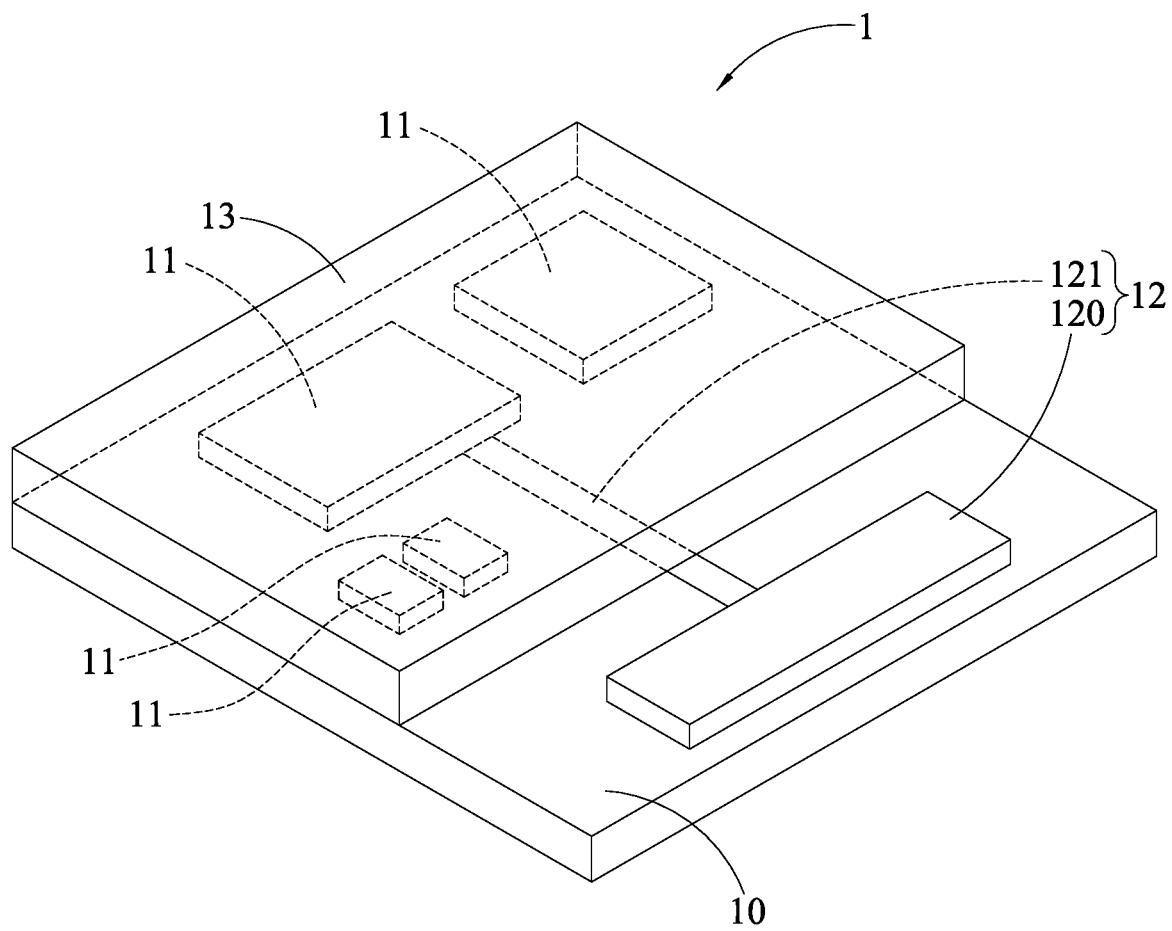
FIG. 1 is a cross-sectional view of a wireless communication module according to the prior art.
Figure 2A:
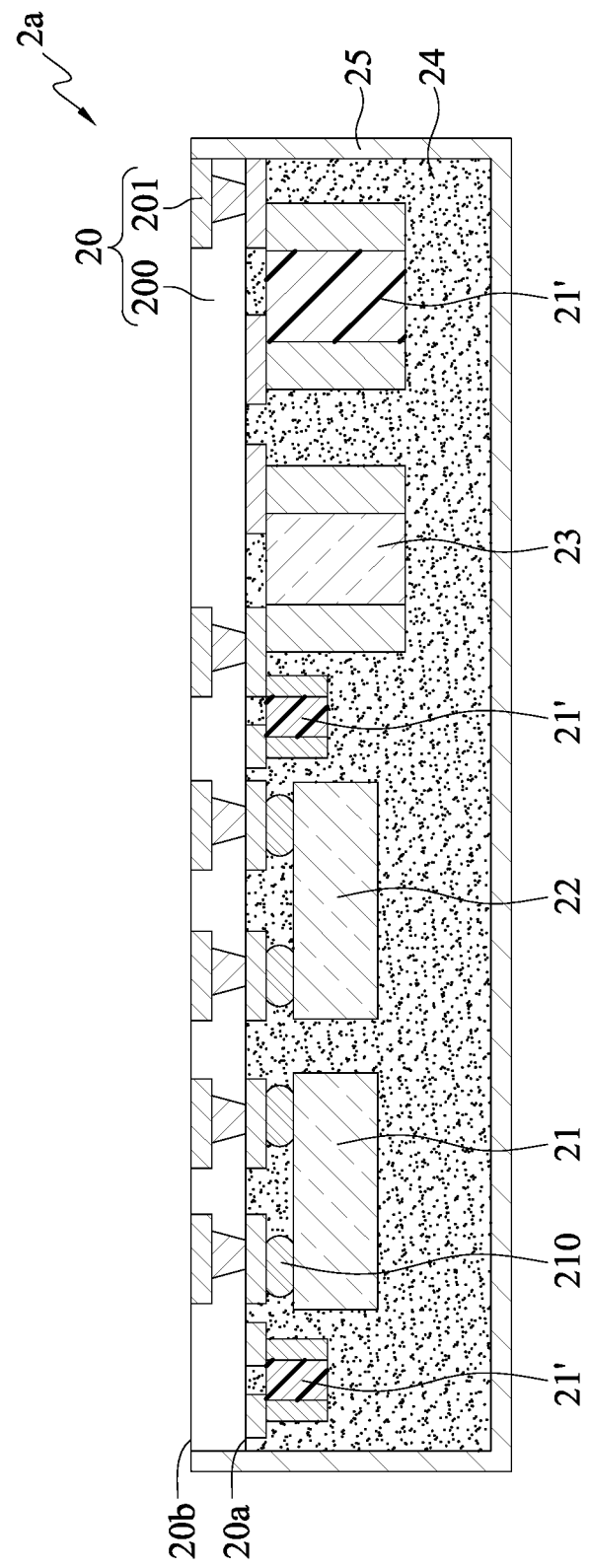
FIGS. 2A and 2B are cross-sectional views illustrating a method for fabricating an electronic package according to the present disclosure.
Figure 2B:
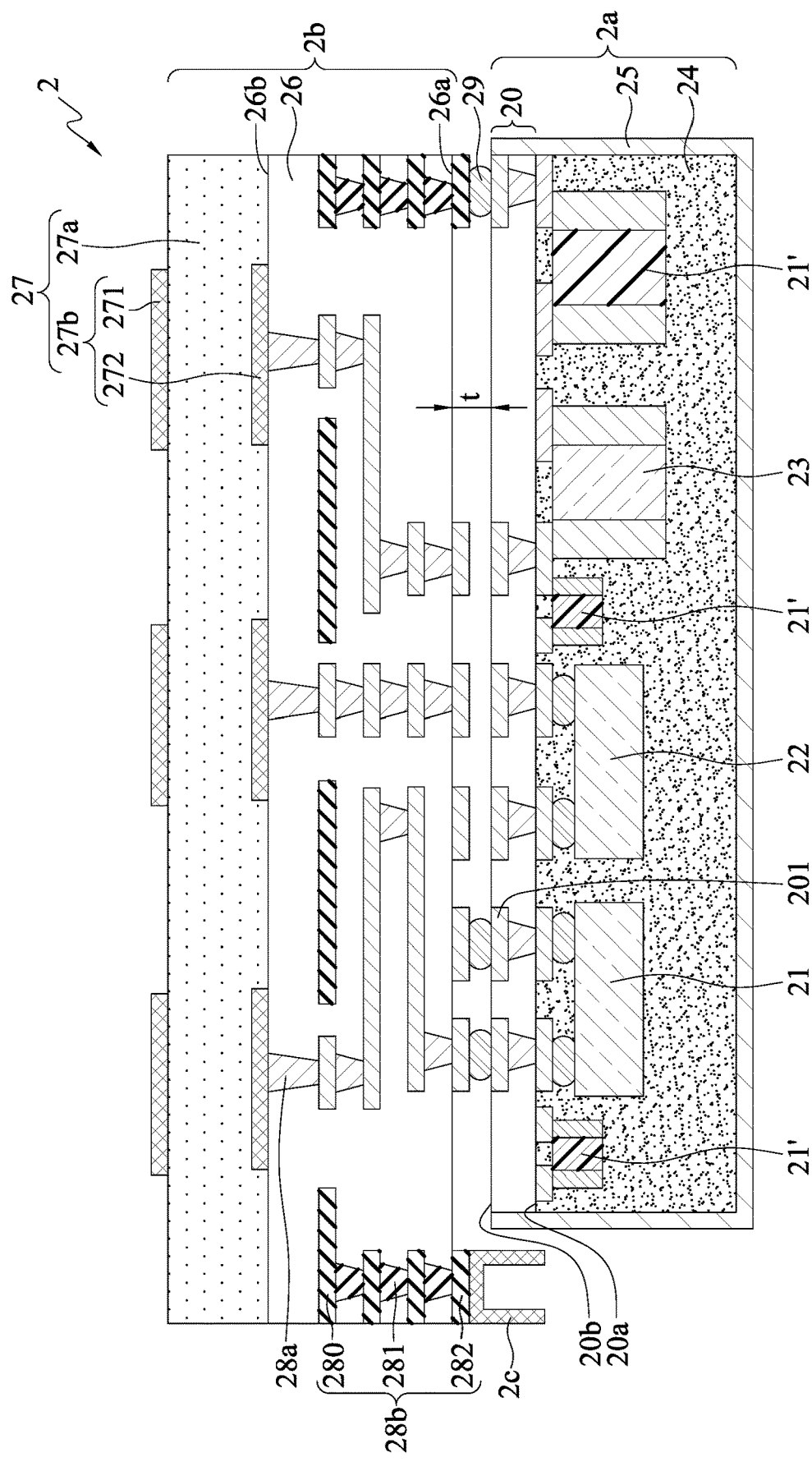
Figure 2B:
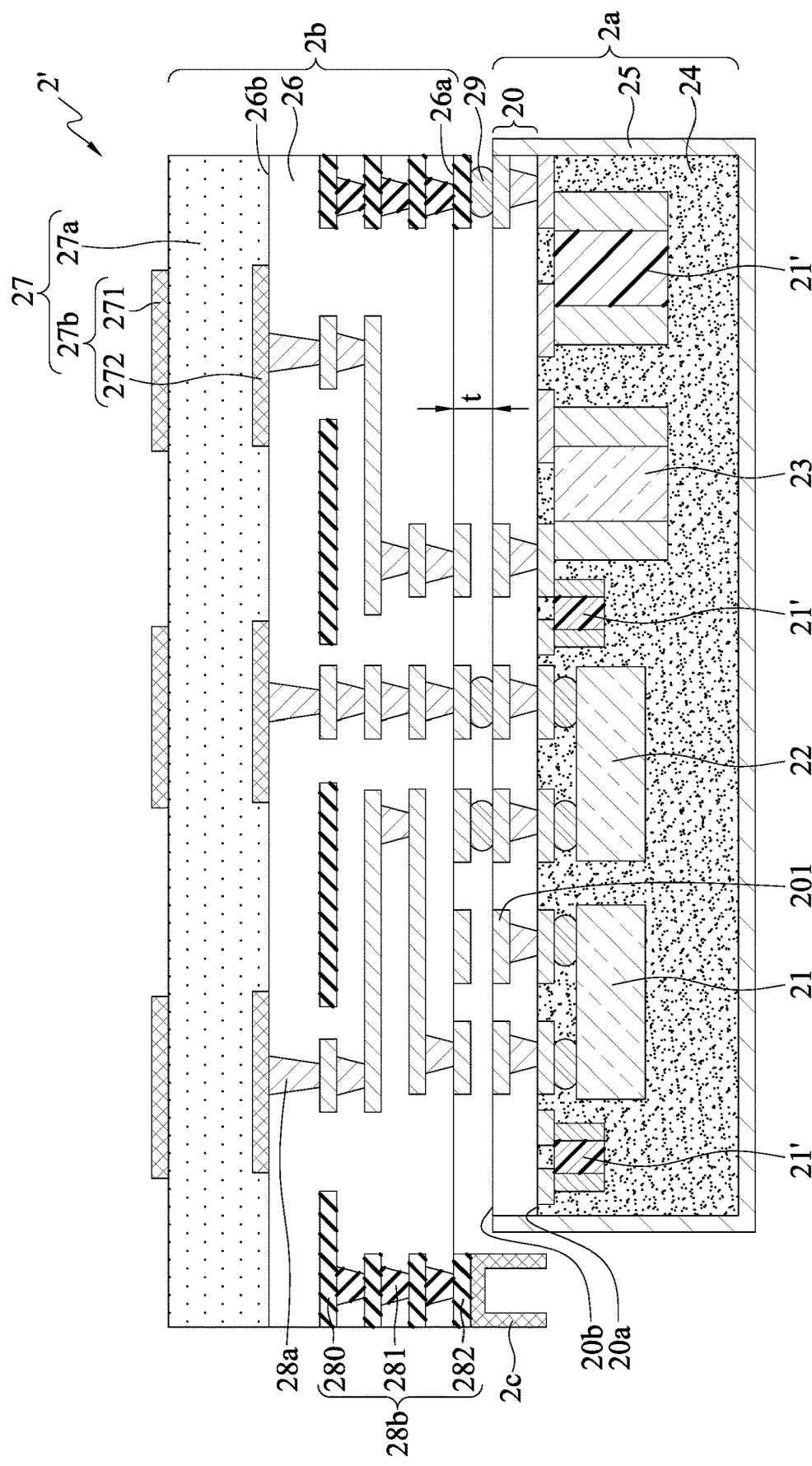

FIGS. 2A and 2B are cross-sectional views illustrating a method for fabricating an electronic package 2 according to the present disclosure.

As shown in FIG. 2A, a packaging structure 2a is provided, comprising a carrier 20, a plurality of electronic components (e.g., a first electronic component 21, a second electronic component 22, a third electronic component 23, and a passive component 21'), an encapsulation layer 24 and at least one metal layer 25.

The carrier 20 is a circuit structure having a core layer or a coreless circuit structure, such as a packaging substrate, which is defined with a first surface 20a and a second surface 20b opposing the first surface 20a. The carrier 20 comprises at least one insulation layer 200 and a circuit layer 201 formed on the insulation layer 200.

In an embodiment, a fan out circuit layer 201 can be formed in a redistribution layer (RDL) manner, and is made of copper. The insulation layer 200 is made of a dielectric material, such as Polybenzoxazole (PBO), Polyimide (PI), Prepreg (PP), etc.

It should be understood that the carrier 20 can be a member, such as a lead frame or a silicon interposer, which can carry an electronic component, such as a chip. However, the present disclosure is not limited to those mentioned above.

In an embodiment, the electronic components are active components, such as radio frequency semiconductor chips, passive components 21', such as resistors, capacitors and inductors, or a combination thereof, disposed on the first surface 20a of the carrier 20, and electrically connected to the circuit layer 201.

In an embodiment, the first electronic component 21 is an active component, such as a semiconductor chip that emits 5G mm wave (60 GHz), and is disposed on the carrier 20 via a plurality of conductive bumps 210 made of a solder tin material, for example, in a flip-chip manner and electrically connected to the circuit layer 201. In another embodiment, the first electronic component 21 is electrically connected via a plurality of solder wires (not shown) to the circuit layer 201 in a wire bonding manner. In yet another embodiment, the first electronic component 21 is in direct contact and electrically connected to the circuit layer 201. However, the electronic components can be electrically connected to the circuit layer 201 in other manners.

In an embodiment, the second and third electronic components 22 and 23 are active components, and can be electrically connected to the circuit layer 201 in any manner mentioned above. In an embodiment, the electronic component 22 is a semiconductor chip that emits 5G mm wave (39 GHz), and the third electronic component 23 is a semiconductor chip that emits 5G mm wave (28 GHz).

The encapsulation layer 24 is formed on the first surface 20a of the carrier 20 and encapsulates the electronic components. In an embodiment, the encapsulation layer 24 is made of an insulation material, such as polyimide (PI), a dry film, an epoxy, or a molding compound.

The metal layer 25 is formed on an outer surface of the encapsulation layer 24. In an embodiment, the metal layer 25 is made of copper (Cu), nickel (Ni), iron (Fe), aluminum (Al) or stainless steel (Sus), and can be electrically connected to the circuit layer 201 optionally.

In an embodiment, the metal layer 25 is formed by electroplating, chemical deposition, physical vapor deposition, sputtering, etc.

As shown in FIG. 2B, an antenna structure 2b is mounted via a plurality of conductive elements 29 onto the packaging structure 2a, and an air gap t is formed between the antenna structure 2b and the packaging structure 2a, so as to form the electronic package 2 according to the present disclosure. Since air is the lowest loss dielectric has a dielectric constant (Dk) of 1, and a dielectric loss (Df) of 0, the formation of the air gap t can improve the antenna effectiveness of the electronic package 2 with respect to a 5G communication function.

In an embodiment, the antenna structure 2b is in the form of an antenna plate, and comprises a base portion 26, an antenna portion 27, a first circuit portion 28a and a second circuit portion 28b bonded to one another. In an embodiment, the conductive elements 29 are solder balls, copper core balls, metal members (in shapes of pillars, bulks or needles), such as copper and gold, or any other suitable members.

The base portion 26 is a plate body, and has a first side 26a and a second side 26b opposing the first side 26a, with the first side 26a mounted onto the second surface 20b of the carrier 20 and the second side 26b bonded to the antenna portion 27. In an embodiment, the base portion 26 is made of a dielectric material, such as PBO, PI, PP, etc.

The first circuit portion 28a is a circuit layer in a fan out redistribution layer (RDL) structure, arranged in the base portion 26, electrically connected to the antenna portion 27, and electrically connected to the circuit layer 201 of the carrier 20 via the conductive elements 29.

The second circuit portion 28b is a circuit layer in a fan out redistribution layer (RDL) structure, is arranged in the base portion 26, and comprises conductive layer 280 that grounds the antenna portion 27, at least one layout layer 281 electrically connected to the conductive layer 280 and the first circuit portion 28a, and a plurality of external pads 282 electrically connected to the layout layer 281 and exposed from the first side 26a.

In an embodiment, the second circuit portion 28b and the first circuit portion 28a can be fabricated together in the base portion 26. In another embodiment, the conductive layer 280 can be at least one complete, meshed or any pattern of metal foil. In yet another embodiment, the conductive layer 280 is a patterned conductive material.

The base portion 26, the first circuit portion 28a and the second circuit portion 28b constitute a circuit structure having a core layer or a coreless circuit structure, such as a packaging substrate.

The external pads 282 are used for a connector 2c to be mounted thereon, and connected to another electronic module (not shown) via the connector 2c. In an embodiment, the electronic module is an antenna component, such as a Sub-6 GHz wavelength antenna. In another embodiment, the electronic package 2 and another antenna module are integrated into a single electronic device, such as a smart phone.

The antenna portion 27 is an mm wave antenna, and is arranged corresponding to the frequency specification of the first electronic component 21, the second electronic component 22 or the third electronic component 23. The conductive layer 280 prevents the antenna portion 27 from generating cross talking, noise interfering and radiation interference to the electronic components.

In an embodiment, the antenna portion 27 comprises an insulating body 27a bonded to the second side 26b of the base portion 26 and an antenna body 27b bonded to the insulating body 27a. In an embodiment, the insulating body 27a is made of polyimide (PI), a dry film, an epoxy or a molding compound. In another embodiment, the antenna portion 27 is fabricated in an RDL process, and has a plate in a desired shape.

The antenna body 27b is bonded to the insulating body 27a and electrically connected to the first electronic component 21, the second electronic component 22 and/or the third electronic component 23 to emit needed mm wave. In an embodiment, the antenna body 27b comprises a first antenna layer 271 and a second antenna layer 272 separated from one another and arranged on two opposing sides of the insulating body 27a, respectively. The first antenna layer 271 is arranged at a position corresponding to the position of the second antenna layer 272. In an embodiment, the first antenna layer 271 is formed on the upper side of the insulating body 27a, and the second antenna layer 272 is formed on a bottom side of the insulating body 27a, is in contact with the second side 26b of the base portion 26 and is electrically connected to the first circuit portion 28a. The antenna body 27b is electrically connected via the first circuit portion 28a, the conductive elements 29 and the circuit layer 201 to the first electronic component 21, the second electronic component 22 and/or the third electronic component 23.

A thin antenna body 27b is fabricated by sputtering, vaporing, electroplating, electroless plating, chemical deposition or foiling. In an embodiment, a patterned conductive material is formed on the insulating body 27a to act as the first antenna layer 271 or the second antenna layer 272, and a layout area of the conductive layer 280 within the base portion 26 is greater than a layout area of the second antenna layer 272 bonded to the base portion 26.

In an embodiment, the first antenna layer 271 and the second antenna layer 272 are coupled and transmit signals to each other. In another embodiment, the first antenna layer 271 and the second antenna layer 272 generate radiation energy by alternating voltages, alternative currents or radiation variation, and the radiation energy is an electromagnetic field, such that the first antenna layer 271 and the second antenna layer 272 are coupled to each other electromagnetically. Accordingly, antenna signals can be transmitted between the first antenna layer 271 and the second antenna layer 272.

It should be understood that there are a variety of types of the antenna structures 2b. In an embodiment, the antenna portion 27 can be stacked via a plurality of supporting members (e.g., solder balls) on the second side 26b of the base portion 26. i.e., the two plate bodies stacked on each other.

In the method according to the present disclosure, the antenna portion 27 is arranged corresponding to the first electronic component 21, the second electronic component 22 and/or the third electronic component 23, and the antenna structure 2b is electrically connected to a radio frequency chip (the first electronic component 21, the second electronic component 22 or the third electronic component 23) of any frequency of the packaging structure 2a, so that the antenna portion 27 of the electronic package 2 can emit 5G mm wave of needed frequencies. As shown in FIG. 2B, the antenna structure 2b is electrically connected to the first electronic component 21, without being electrically connected to the electronic component 22 and the third electronic component 23, allowing the antenna portion 27 of the electronic package 2 to emit 5G mm wave at a frequency of 60 GHz. As shown in FIG. 2B', the antenna structure 2b is electrically connected to the second electronic component 22, without being electrically connected to the first electronic component 21 and the third electronic component 23, allowing the antenna portion 27 of the electronic package 2' to emit 5G mm wave at a frequency of 39 GHz. As shown in FIG. 2B", the antenna structure 2b is electrically connected to the third electronic component 23, without being electrically connected to the first electronic component 21 and the second electronic component 22, allowing the antenna portion 27 of the electronic package 2" to emit 5G mm wave at a frequency of 28 GHz.

Compared with the prior art, the method according to the present disclosure, in mass production of an electronic package, allows the packaging structure 2a to comprise radio frequency chips of various frequencies (the first electronic component 21, the second electronic component 22 and the third electronic component 23), and electrically connects the antenna structure 2b of different antenna types (the first antenna layer 271 and the second antenna layer 272 of the antenna portion 27 have patterns that change based on the radio frequency requirement, or the antenna structure 2b has a thickness that changes based on the radio frequency requirement) to the packaging structure 2a of the same type (or one of the radio frequency chips), so that radio frequency products of various frequencies can be produced. Radio frequency chips of different frequencies need not be fabricated into a variety of individual packaging modules (for example, three production lines of three different fabrication processes are needed for producing three types of packaging structures). Therefore, the production cost is reduced, and the production speed is increased.

In the method according to the present disclosure, the antenna structure 2b is fabricated in a circuit substrate fabricating process, and integrated with the packaging structure 2a. Therefore, the antenna structure 2b and the packaging structure 2a can be packaged together and stacked on each other, which is of benefit to the packaging process. In an embodiment, the antenna structure 2b is stacked on the packaging structure 2a, and no additional layout area is required on the first surface 20a of the carrier 20. Compared with the prior art, the method according to the present disclosure can add the antenna function (e.g., the signal transmission function of the connector 2c) under the predefined carrier 20 size, to meet the requirements that two antennas can operate and the electronic package 2 is minimized. The molds used in the packaging process correspond to the size of the base portion 26, which is of benefit to the packaging process. It is thus not necessary to add an additional layout area on the second surface 20b of the carrier 20. Therefore, the method according to the present disclosure can fabricate an antenna (i.e., an mm wave antenna) under the predefined carrier 20 size, and ensure that the electronic package 2, 2', 2" meets the miniature requirement.

A 5G system needs more circuit arrangements in order to meet the signal quality and transmission speed requirement and improve the signal quality and transmission speed. The method according to the present disclosure fabricates the antenna structure 2b in the circuit substrate fabricating process, and arranges the first circuit portion 28a and the second circuit portion 28b in the base portion 26 under a condition that the carrier 20 has fixed length and width. Therefore, the circuit layout space is increased (i.e. number of layers), and so is the function of the antenna structure 2b. Accordingly, the electronic package 2, 2', 2" can provide the electric functions needed for the operation of a 5G system, and to achieve the antenna operation requirement of the 5G system.

The carrier 20 and the base portion 26 are provided with the circuits needed for a 5G system, and the yield factor of the carrier 20 and the base portion 26 can be increased. In an embodiment of a six-layered circuit, the yield factor of each of which is 95%, two circuit layers 201 can be arranged in the carrier 20, a four-layered circuit of the first circuit portion 28a can be arranged in the base portion 26, and the yield factors of the carrier 20 and the antenna structure 2b are 90.3% (i.e., $0.95^2$) and 81.5% (i.e., $0.95^4$), respectively. Therefore, the antenna structure 2b can be fabricated in the current fabrication process, and has a reduced cost. Accordingly, the yield factor of the electronic package 2, 2', 2" is increased (as mentioned above, the lowest is 81.5%, which is greater than 73.5% of the prior art).

Figure 3:
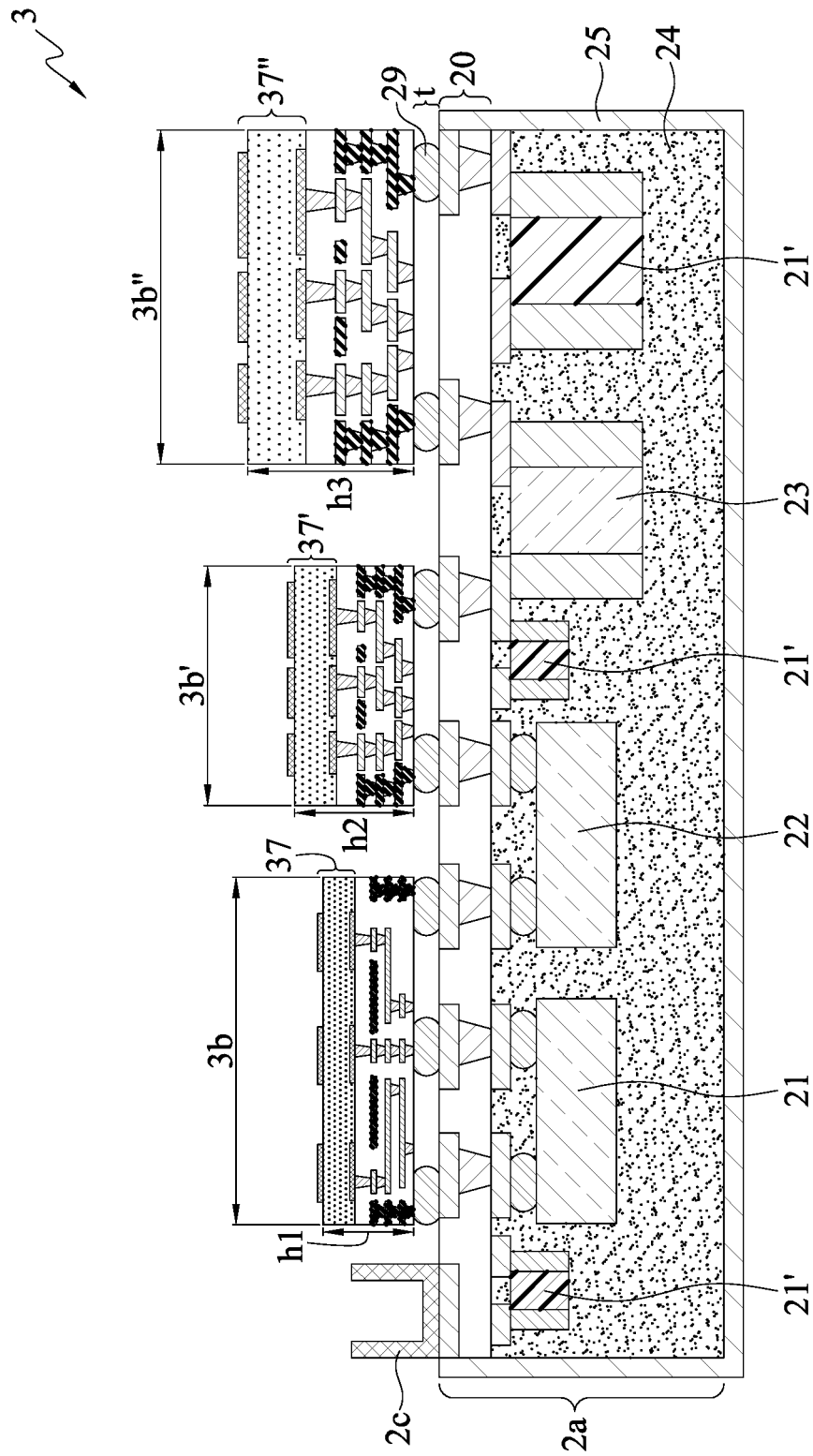
FIG. 3 is a cross-sectional view of an electronic package of another embodiment according to the present disclosure.

In another embodiment, as shown in FIG. 3, which is subsequent to the process of FIG. 2A, a plurality of antenna structures 3b, 3b' and 3b" are mounted via a plurality of conductive elements 29 onto the packaging structure 2a, and the respective antenna portions 37, 37' and 37" of the antenna structures 3b, 3b' and 3b" are arranged corresponding to the first to third electronic components 21, 22 and 23, respectively, and the connector 2c is disposed on the second surface 20b of the carrier 20 of the packaging structure 2a.

In an embodiment, the respective thicknesses h1, h2 and h3 of the antenna structures 3b, 3b' and 3b" correspond to the radio frequencies of the first to third electronic components 21, 22 and 23, respectively. In an embodiment, the radio frequency of the first electronic component 21 is 60 GHz (the highest), and the thickness h1 of the antenna structure 3b under a condition that Dk is 3.2 is about at least 167 μm (thinnest). In another embodiment, the radio frequency of the second electronic component 23 is 38 GHz, the thickness h2 of the antenna structure 3b' under a condition that Dk is 3.2 is about at least 288 μm. In yet another embodiment, the radio frequency of the third electronic component 23 is 28 GHz (lowest), the thickness h3 of the antenna structure 3b" under a condition that Dk is 3.2 is about at least 390 (thickest). It should be understood that the thicknesses of the antenna structures 2b shown in FIGS. 2B, 2B' and 2B" can correspond to the frequencies (60 GHz, 39 GHz, 28 GHz) of signals emitted therefrom.

The electronic package 3 can control the operation of the first to third electronic components 21, 22 and 23 based on demands, and decide to emit a single signal or a plurality of signals. In an embodiment, the antenna portions 37, 37' and 37" can emit 5G mm wave signals of different frequencies (60 GHz, 39 GHz, 28 GHz) at the same time. Therefore, the antennas of different frequencies need not be fabricated into individual electronic packages (as shown in FIGS. 2B, 2B' and 2B"). Accordingly, the area of the final product (e.g., a soft circuit board) is reduced, and the compact-size and low-profile requirements for a final product can be met.

In the electronic package 2, 2', 2", 3 according to the present disclosure, the antenna structure 2b, 3b, 3b', 3b" (i.e., an antenna module) and the packaging structure 2a (i.e., a chip module) are fabricated independently, and then stacked and bonded to each other, so that the time for fabricating the electronic package 2, 2', 2", 3 is greatly reduced. In general, a packaging factory cannot arrange an antenna component (e.g., an antenna frame) onto a packaging substrate until the antenna component is fabricated completely, which wastes time. By contrast, in the method according to the present disclosure the antenna component (i.e., the antenna structure 2b, 3b, 3b', 3b") is handed over to a carrier factory to fabricate, and the packaging factory can fabricate the packaging structure 2a at the same time. Therefore, the antenna structure 2b, 3b, 3b', 3b" and the packaging structure 2a are fabricated completely at the same time, and the packaging factory can assemble the antenna structure 2b, 3b, 3b', 3b" and the packaging structure 2a as soon as the packaging structure 2a is fabricated completely. In such a scenario, the fabrication time is greatly reduced and fabrication window period (i.e. the time waiting for fabrication of the antenna component) will not be generated.

The present disclosure further provides an electronic package 2, 2', 2", 3, which comprises a packaging structure 2a and at least one antenna structure 2b, 3b, 3b', 3b".

The packaging structure 2a comprises a carrier 20 provided with a circuit layer 201 and a plurality of electronic components (first to third electronic components 21, 22 and 23). The carrier 20 has a first surface 20a and a second surface 20b opposing the first surface 20a. The first to third electronic components 21, 22 and 23 are disposed on the first surface 20a of the carrier 20 and electrically connected to the circuit layer 201.

The antenna structure 2b, 3b, 3b', 3b" is stacked via a plurality of conductive elements 29 on the packaging structure 2a, and is electrically connected via a plurality of conductive elements 29 to the circuit layer 201, allowing the antenna structure 2b, 3b, 3b', 3b" to be electrically connected to the first electronic component 21, the second electronic component 22 and/or the third electronic component 23.

In an embodiment, the first to third electronic components 21, 22 and 23 are different radio frequency chips.

In an embodiment, the thickness h1, h2, h3 of the antenna structure 2b, 3b, 3b', 3b" corresponds to the radio frequency of the first to third electronic components 21, 22 and 23.

In an embodiment, a single one of the antenna structure 2b is stacked on the packaging structure 2a, and is electrically connected to the first electronic component 21, the second electronic component 22 or the third electronic component 23 only.

In an embodiment, a plurality of the antenna structures 3b, 3b' and 3b" are stacked on the packaging structure 2a and arranged corresponding to the first electronic component 21, the second electronic component 22 and the third electronic component 23, and the antenna structures 3b, 3b' and 3b" are electrically connected to the first electronic component 21, the second electronic component 22 and the third electronic component 23, respectively.

In an embodiment, an air gap t is formed between the antenna structure 2b, 3b, 3b', 3b" and the packaging structure 2a.

In an embodiment, the antenna structure 2b, 3b, 3b', 3b" comprises an antenna portion 27, 37, 37', 37", the antenna portion 27, 37, 37', 37" comprises an insulating body 27a and an antenna body 27b, and the antenna body 27b comprises a first antenna layer 271 and a second antenna layer 272 arranged on two opposing sides of the insulating body 27a, respectively.

In an embodiment, the antenna structure 2b, 3b, 3b', 3b" further comprises a base portion 26 bonded to the antenna portion 27, 37, 37', 37" and first and second circuit portions 28a and 28b arranged in the base portion 26. The base portion 26 is stacked via the plurality of conductive elements 29 on the second surface 20b of the carrier 20. The first circuit portion 28a is electrically connected to the circuit layer 201 and the antenna portion 27, 37, 37', 37".

In an embodiment, the antenna structure 2b, 3b, 3b', 3b" is an mm wave antenna plate. In an embodiment, the electronic package 2, 2', 2", 3 further comprises a connector 2c arranged on the carrier 20 or on the antenna structure 2b, 3b, 3b', 3b".

In the electronic package and the method for fabricating the same according to the present disclosure, a plurality of electronic components of different radio frequencies are disposed in a single packaging structure, and, in mass production, antenna structures of different types of antennas are stacked on the packaging structure, and radio frequency products of different frequencies can be fabricated. It is not necessary to fabricate radio frequency chips of different frequencies into individual packaging modules. In the process of fabricating the electronic package, the antenna structure and the packaging structure can be fabricated independently at the same time (for example, the antenna structure is fabricated by a carrier factory, while the packaging structure is fabricated by a packaging factory, and the antenna structure and the packaging structure are assembled by the packaging factory). Therefore, the number of production lines and the production cost can be reduced, and the production speed and the yield can be increased. If the packaging factory fabricates radio frequency chips of different frequencies into individual packaging modules, the packaging factory has to wait for the carrier factory to fabricate the antenna structure completely, and then fabricates needed individual packaging modules based on the antenna structure (for example, when the carrier factory is fabricating the antenna structure, the packaging factory can do nothing but wait, since the packaging factory does not obtain the antenna specification and cannot fabricate the individual packaging modules).

In the method according to the present disclosure, the antenna structure is fabricated in a circuit substrate process, and the antenna structure and the packaging structure can be packaged together (e.g., a packaging factory assembles the antenna structure and the packaging structure), which is of benefit for the packaging process, and ensures that the electronic package meets the miniature requirement.

The antenna structure is fabricated in the circuit substrate process (e.g., the antenna structure is fabricated by a carrier factory), to increase the circuit layout space and the functions of the antenna structure. Therefore, the electronic package can meet the antenna operation requirement of a 5G system, and the yield of the electronic package can be increased.

In the electronic package according to the present disclosure, the antenna structure and the packaging structure are fabricated independently at the same time, which can greatly reduce the time for fabricating the electronic package.

The foregoing descriptions of the detailed embodiments are only illustrated to disclose the features and functions of the present disclosure and not restrictive of the scope of the present disclosure. It should be understood to those in the art that all modifications and variations according to the spirit and principle in the disclosure of the present disclosure should fall within the scope of the appended claims.

What is claimed is:

1. An electronic package, comprising:
   a packaging structure, comprising:
      a carrier disposed with a circuit layer and having a first surface and a second surface opposing the first surface; and
      a plurality of electronic components disposed on the first surface of the carrier and electrically connected to the circuit layer, wherein the plurality of electronic components are radio frequency semiconductor chips; and
   at least one antenna structure stacked via a plurality of conductive elements on the second surface of the carrier and electrically connected to the circuit layer and one of the plurality of electronic components without being connected to any other of the plurality of electronic components.

2. The electronic package of claim 1, wherein the electronic components are different radio frequency chips.

3. The electronic package of claim 1, wherein the antenna structure has a thickness corresponding to a radio frequency of the electronic components.

4. The electronic package of claim 1, wherein a single one of the at least one antenna structure is stacked on the packaging structure and electrically connected to one of the electronic components.

5. The electronic package of claim 1, wherein a plurality of the antenna structures are stacked on the packaging structure and arranged corresponding to the electronic components, and each of the antenna structures is electrically connected to each of the electronic components, respectively.

6. The electronic package of claim 1, wherein an air gap is formed between the antenna structure and the packaging structure.

7. The electronic package of claim 1, wherein the antenna structure includes an antenna portion, and wherein the antenna portion includes an insulating body and an antenna body, and the antenna body includes a first antenna layer and a second antenna layer formed on two opposing sides of the insulating body, respectively.

8. The electronic package of claim 7, wherein the antenna structure further comprises:
   a base portion bonded to the antenna portion and stacked via the conductive elements on the second surface of the carrier; and
   a circuit portion disposed in the base portion and electrically connected to the circuit layer and the antenna portion.

9. The electronic package of claim 1, wherein the antenna structure is an mm wave antenna plate.

10. The electronic package of claim 1, further comprising a connector disposed on the carrier or on the antenna structure.

11. A method for fabricating an electronic package, comprising:
    providing a packaging structure, the packaging structure comprising:
       a carrier disposed with a circuit layer and a first surface and a second surface opposing the first surface; and
       a plurality of electronic components disposed on the first surface of the carrier and electrically connected to the circuit layer, wherein the plurality of electronic components are radio frequency semiconductor chips; and
    stacking at least one antenna structure via a plurality of conductive elements on the second surface of the carrier, and electrically connecting the at least one antenna structure to the circuit layer and one of the plurality of electronic components without being connected to any other of the plurality of electronic components.

12. The method of claim 11, wherein the electronic components are different radio frequency chips.

13. The method of claim 11, wherein the antenna structure has a thickness corresponding to a radio frequency of the electronic components.

14. The method of claim 11, wherein a single one of the antenna structure is stacked on the packaging structure and electrically connected to one of the electronic components.

15. The method of claim 11, wherein a plurality of the antenna structures are stacked on the packaging structure and arranged corresponding to the electronic components, and each of the antenna structures is electrically connected to each of the electronic components, respectively.

16. The method of claim 11, wherein an air gap is formed between the antenna structure and the packaging structure.

17. The method of claim 11, wherein the antenna structure includes an antenna portion, and wherein the antenna portion has an insulating body and an antenna body, and the antenna body has a first antenna layer and a second antenna layer formed on two opposing sides of the insulating body, respectively.

18. The method of claim 17, wherein the antenna structure further comprises:
    a base portion bonded to the antenna portion and stacked via the conductive elements on the second surface of the carrier; and
    a circuit portion arranged in the base portion and electrically connected to the circuit layer and the antenna portion.

19. The method of claim 11, wherein the antenna structure is an mm wave antenna plate.

20. The method of claim 11, further comprising arranging a connector on the carrier or on the antenna structure.

* * * * *